United States Patent
Wu et al.

(10) Patent No.: US 11,901,353 B2
(45) Date of Patent: Feb. 13, 2024

(54) INTEGRATED CIRCUITS INCLUDING COIL CIRCUIT AND SCR

(71) Applicant: Taiwan Semiconductor Manufacturing Company, Ltd., Hsinchu (TW)

(72) Inventors: Wei-Min Wu, Hsinchu (TW); Ming-Dou Ker, Hsinchu (TW); Chun-Yu Lin, Taipei (TW); Li-Wei Chu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 242 days.

(21) Appl. No.: 17/200,527

(22) Filed: Mar. 12, 2021

(65) Prior Publication Data
US 2022/0293583 A1    Sep. 15, 2022

(51) Int. Cl.
*H01L 27/02* (2006.01)
*H01L 29/74* (2006.01)

(52) U.S. Cl.
CPC ...... *H01L 27/0248* (2013.01); *H01L 29/7412* (2013.01); *H01L 29/7436* (2013.01)

(58) Field of Classification Search
CPC .............. H01L 27/0248; H01L 29/7412
See application file for complete search history.

(56) References Cited

U.S. PATENT DOCUMENTS

| 8,952,456 B2 | 2/2015 | Ker et al. |
| 2011/0207409 A1* | 8/2011 | Ker .............. H01L 27/0262 |
| | | 257/355 |

OTHER PUBLICATIONS

Razavi, Behzad, "The Bridged T-Coil", IEEE Solid-Sate Circuits Magazine, Fall 2015, pp. 9-13 (Year: 2015).*
L. Chu et al., "ESD Protection Design for Wideband RF Applications in 65-nm CMOS Process," *2014 IEEE International Symposium on Circuits and Systems (ISCAS)*, Melbourne, VIC, Australia, 2014, pp. 1480-1483, doi: 10.1109/ISCAS.2014.6865426. (4 pages).
C. Lin, et al, "ESD Protection Design for 60-GHz LNA With Inductor-Triggered SCR in 65-nm CMOS Process," in *IEEE Transactions on Microwave Theory and Techniques*, vol. 60, No. 3, pp. 714-723, Mar. 2012, doi: 10.1109/TMTT.2011.2178425. (10 pages).

(Continued)

*Primary Examiner* — Matthew C Landau
*Assistant Examiner* — Mark Hatzilambrou
(74) *Attorney, Agent, or Firm* — Finnegan, Henderson, Farabow, Garrett & Dunner, L.L.P.

(57) ABSTRACT

An integrated circuit includes a T-coil circuit, a silicon-controlled rectifier (SCR), and a signal-loss prevention circuit. The T-coil circuit is coupled to an input/output (I/O) pad and an internal circuit. The SCR is coupled to the T-coil circuit and the internal circuit. The signal-loss prevention circuit is coupled to the T-coil circuit and the SCR. The signal-loss prevention circuit includes a resistor coupled to the T-coil circuit and the SCR. An electrostatic current flows through the resistor and turns on the SCR. The signal-loss prevention circuit may also include a diode circuit coupled to the T-coil circuit and the SCR. The diode circuit is configured to prevent signal loss.

20 Claims, 6 Drawing Sheets

(56) References Cited

OTHER PUBLICATIONS

S. Galal et al., "Broadband ESD Protection Circuits in CMOS Technology," in *IEEE Journal of Solid-State Circuits*, vol. 38, No. 12, pp. 2334-2340, Dec. 2003, doi: 10.1109/JSSC.2003.818568. (7 pages).

M.S. Keel and E.Rosenbaum, "CDM-Reliable T-coil Techniques for a 25-GB/s Wireline Receiver Front-End," *IEEE Trans. Device Mater. Rel.*, vol. 16, No. 4, pp. 513-520, Dec. 2016 (8 pages).

D. Linten, S. Thijs, M. Okushima, M. Scholz, J. Borremans, M. Dehan, and G. Groeseneken, "A 4.5 kV HBM, 300 V CDM, 1.2 kV HMm ESD protected DC-to-16.1 GHz wideband LNA in 90 nm CMOS," in *Proc. EOS/ESD Symp.*, 2009, pp. 352-357 (6 pages).

\* cited by examiner

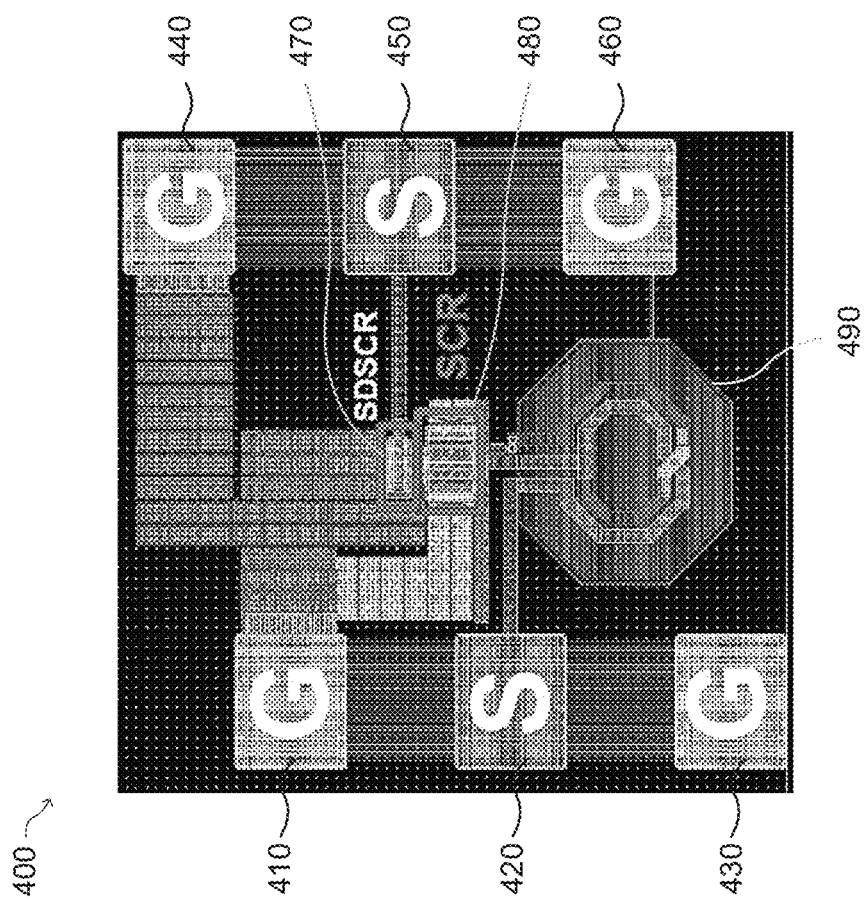

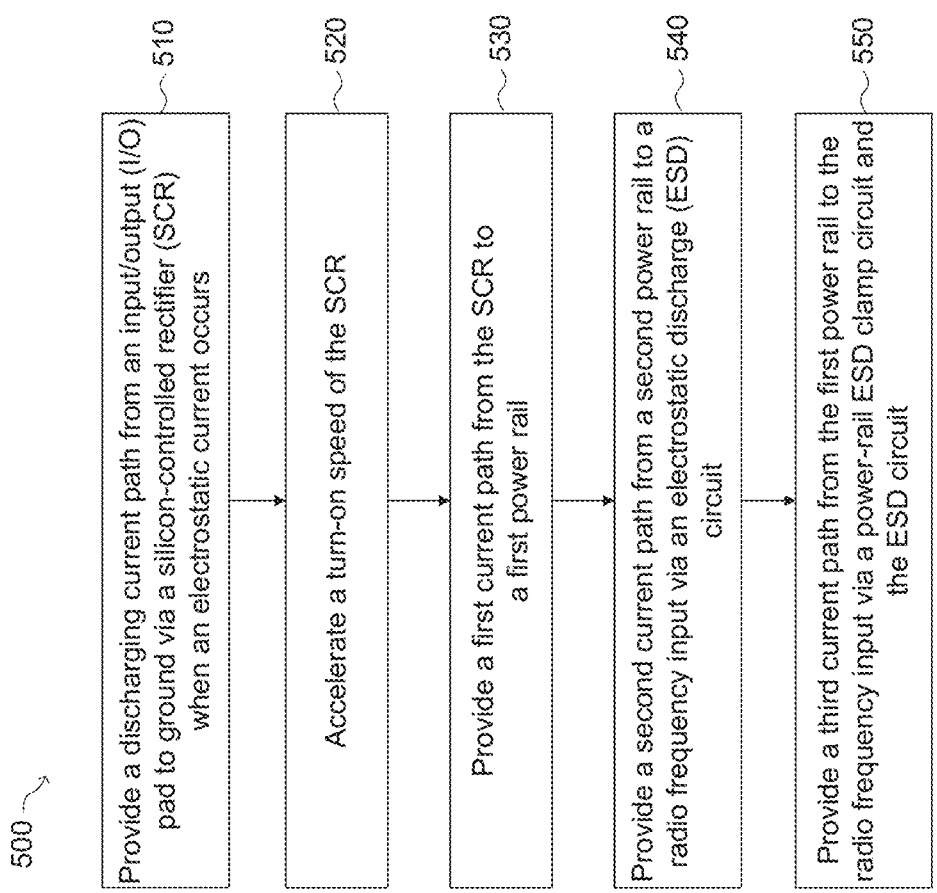

INTEGRATED CIRCUITS INCLUDING COIL CIRCUIT AND SCR

BACKGROUND

The present disclosure relates to integrated circuits and methods of the same.

Integrated circuit chips need to operate in different scenarios. The integrated circuit chips also need to perform their functions correctly in the different scenarios. The integrated circuit chips may include different circuits and methods to address the different scenarios.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a layout of an exemplary integrated circuit, in accordance with some embodiments.

FIG. 5 is a flowchart of an exemplary method, in accordance with some embodiments.

DETAILED DESCRIPTION

Figure 1:
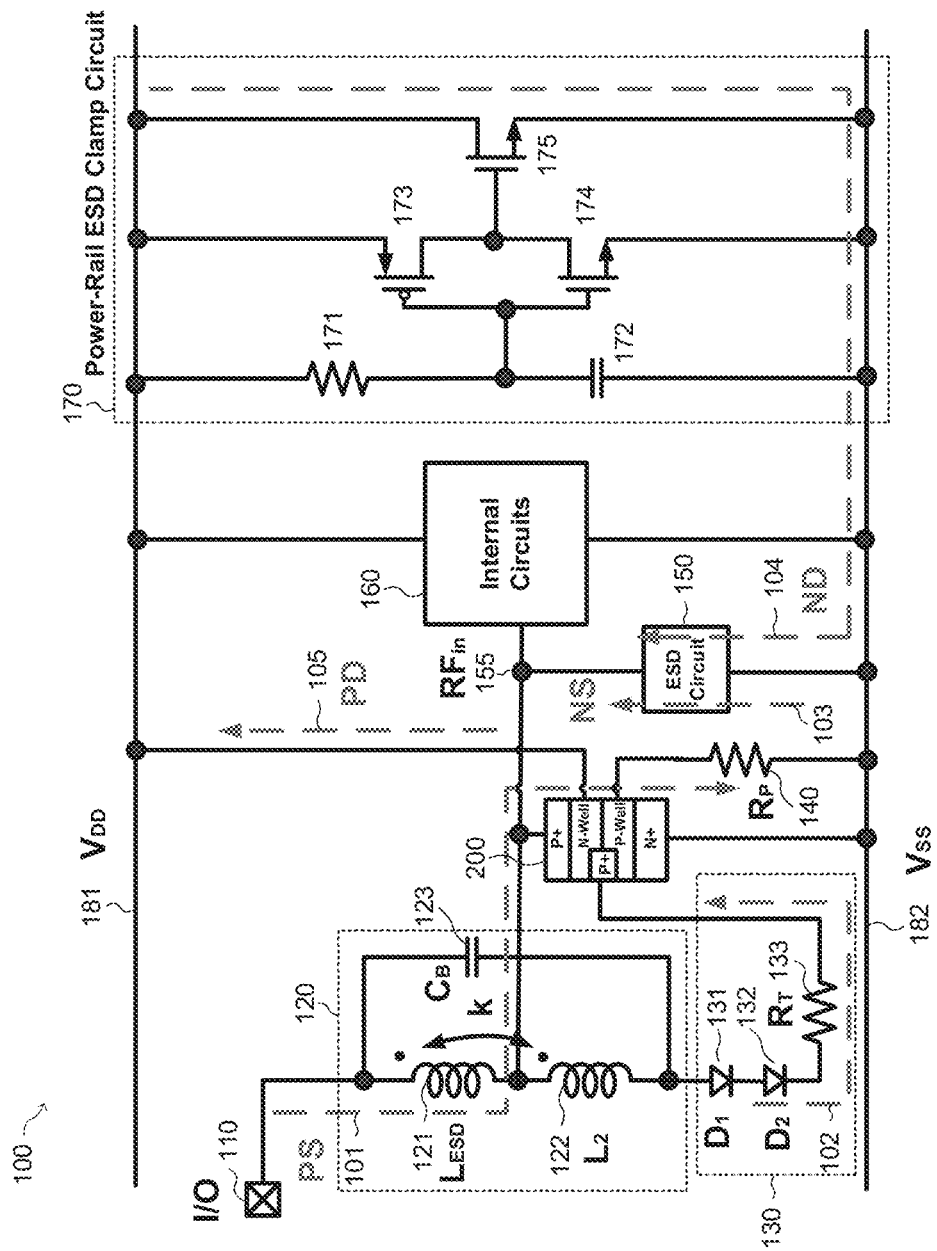
FIG. 1 illustrates an exemplary integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For integrated circuit chips, electrostatic discharge (ESD) may occur in various situations. For example, an electrostatically charged human body contacts a chip and forms a discharge path. As another example, a charged machine or tool with a static charge contacts the chip and forms a discharge path to the ground while on the production line. It is also possible that the chip is charged during fabrication, production, or transportation. The charge transfer takes place between the inside and the outside of the chip after the chip comes into contact with any conductors or ground. ESD may cause a failure of the integrated circuit chip. Thus, ESD protection is therefore needed for integrated circuit chips.

In accordance with some embodiments, an integrated circuit includes a T-coil circuit, a silicon-controlled rectifier (SCR), and a signal-loss prevention circuit. The T-coil circuit is coupled to an input/output (I/O) pad and an internal circuit. The SCR is coupled to the T-coil circuit and is coupled to the internal circuit. The signal-loss prevention circuit is coupled to the T-coil circuit and the SCR. In some embodiments, the signal-loss prevention circuit includes a resistor. The resistor is coupled to the T-coil circuit and the SCR. In some embodiments, an electrostatic current is configured to flow through the resistor and turn on the SCR. In some embodiments, the signal-loss prevention circuit includes a diode circuit. The diode circuit is coupled to the T-coil circuit and the SCR. The diode circuit is configured to prevent signal loss.

In some embodiments, the integrated circuit further includes a power-rail ESD clamp circuit. The power-rail ESD clamp circuit is coupled to a first power rail and a second power rail. In some embodiments, the internal circuit is coupled to the first and second power rails. In some embodiments, the integrated circuit further includes an ESD circuit. The ESD circuit is coupled to a node between the SCR and the internal circuit.

FIG. 1 illustrates an exemplary integrated circuit 100, in accordance with some embodiments. Integrated circuit 100 includes an input/output (I/O) pad 110, a T-coil circuit 120, a signal-loss prevention circuit 130, a silicon-controlled rectifier (SCR) 200, a resistor $R_P$ 140, an ESD circuit 150, internal circuits 160, a power-rail ESD clamp circuit 170, and two power rails 181 and 182.

T-coil circuit 120 is coupled to I/O pad 110 and internal circuits 160. SCR 200 is coupled to T-coil circuit 120 and power rail 182. SCR 200 is coupled to internal circuits 160. SCR 200 is also coupled from a P-Well region of SCR 200 to power rail 182 via resistor $R_P$ 140. SCR 200 is also coupled from an N-Well region of SCR 200 to power rail 181. Signal-loss prevention circuit 130 is coupled to T-coil circuit 120 and SCR 200. ESD circuit 150 is coupled to a node between SCR 200 and internal circuits 160. ESD circuit 150 is also coupled to power rail 182. Internal circuits 160 are coupled between power rails 181 and 182. Power-rail ESD clamp circuit 170 is also coupled to power rails 181 and 182. Power rails 181 and 182 are coupled to voltages $V_{DD}$ and $V_{SS}$, respectively.

T-coil circuit 120 includes an inductor $L_{ESD}$ 121, an inductor $L_2$ 122, and a capacitor $C_B$ 123. Inductor $L_{ESD}$ 121 and inductor $L_2$ 122 are coupled in series. Capacitor $C_B$ 123 is coupled to and across inductor $L_{ESD}$ 121 and inductor $L_2$ 122, as illustrated in FIG. 1. Inductor $L_{ESD}$ 121 is coupled to I/O pad 110. T-coil circuit 120 is coupled from a node between inductor $L_{ESD}$ 121 and inductor $L_2$ 122 to internal circuits 160. T-coil circuit 120 is also coupled from the node between inductor $L_{ESD}$ 121 and inductor $L_2$ 122 to SCR 200. T-coil circuit 120 is also coupled from inductor $L_2$ 122 to SCR 200 via signal-loss prevention circuit 130.

SCR 200 includes a first P+ region, an N-Well region, a second P+ region, a P-Well region, and an N+ region. SCR 200 is coupled from the first P+ region of SCR 200 to the node between inductor $L_{ESD}$ 121 and inductor $L_2$ 122 of T-coil circuit 120. Moreover, SCR 200 is coupled from the first P+ region of SCR 200 to internal circuits 160. In view of the coupling between T-coil circuit 120 and internal circuits 160, SCR 200 is coupled from the first P+ region of SCR 200 to a node on a connection between T-coil circuit 120 and internal circuits 160.

SCR 200 is also coupled from the N+ region of SCR 200 to power rail 182. SCR 200 is further coupled from the second P+ region of SCR 200 to inductor $L_2$ 122 of T-coil circuit 120 via signal-loss prevention circuit 130.

In some embodiments, power rail 181 may be configured for coupling to voltage $V_{DD}$ as a high level of voltage or a level of voltage equivalent to a logic 1. In some embodiments, power rail 182 may be configured for coupling to voltage $V_{SS}$ as a ground level of voltage or a level of voltage equivalent to a logic 0.

Signal-loss prevention circuit 130 includes a diode circuit and a resistor $R_T$ 133. The diode circuit and resistor $R_T$ 133 are coupled in series. More particularly, the diode circuit includes a first diode $D_1$ 131 and a second diode $D_2$ 132 coupled in series, and resistor $R_T$ 133 is coupled in series with diode $D_1$ 131 and diode $D_2$ 132. Inductor $L_2$ 122 of T-coil circuit 120, diode $D_1$ 131, diode $D_2$ 132, and resistor $R_T$ 133 of signal-loss prevention circuit 130, and the second P+ region of SCR 200 are coupled in series.

Signal-loss prevention circuit 130 is coupled between inductor $L_2$ 122 of T-coil circuit 120 and the second P+ region of SCR 200 and configured to prevent signal loss in input signals at I/O pad 110 due to signal-loss prevention circuit 130 and SCR 200 when integrated circuit 100 operates in a normal situation, i.e., no static electricity at I/O pad 110. For example, as shown in FIG. 1, signal-loss prevention circuit 130 includes diode D1 131 and diode D2 132 that begin conducting current only if a threshold voltage of diode D1 131 and diode D2 132 is present in a forward direction, i.e., from inductor L2 122 of T-coil circuit 120 to the second P+ region of SCR 200. When integrated circuit 100 operates in a normal situation, there is no or only a very minor voltage difference from inductor L2 122 of T-coil circuit 120 to the second P+ region of SCR 200 that is less than the threshold voltage of diode D1 131 and diode D2 132. Thus, there is no conductive path from inductor L2 122 of T-coil circuit 120 to the second P+ region of SCR 200 and therefore no signal loss from I/O pad 110 through signal-loss prevention circuit 130 and SCR 200 to $V_{SS}$. In other words, the threshold voltage of diode D1 131 and diode D2 132 prevents signal loss when integrated circuit 100 operates in a normal situation.

When static electricity is present at I/O pad 110, inductor L1 121 of T-coil circuit 120 and SCR 200 form a conductive path for electrostatic current 101 to flow from I/O pad 110 to $V_{SS}$. In addition, when the static electricity is present, a voltage difference exists between T-coil circuit 120 and SCR 200 that is larger than the threshold voltage of diode D1 131 and diode D2 132. As a result, diode D1 131 and diode D2 132 begin conducting current via inductor L2 122 of T-coil circuit 120 to the second P+ region of SCR 200, which constitutes electrostatic current 102. Electrostatic current 102 is an additional current flowing from the second P+ region of SCR 200 to $V_{SS}$ via the P-well and N+ region, which causes SCR 200 to turn on quickly to discharge a large amount of static electricity from I/O pad 110. In this manner, signal-loss prevention circuit 130 is configured to provide a current path from inductor $L_2$ 122 of T-coil circuit 120 to the second P+ region of SCR 200 for electrostatic current 102 to flow through and accelerate a turn-on speed of SCR 200 for electrostatic discharge.

Resistances of forward-biased diode D1 131 and diode D2 132 are minor. Resistor $R_T$ 133 is a main resistance of signal-loss prevention circuit 130 to adjust a volume of electrostatic current 102 so that electrostatic current 102 turns on SCR 200 quickly enough to discharge a large amount static electricity.

In some embodiments, signal-loss prevention circuit 130 may be an acceleration circuit in integrated circuit 100 and is configured to accelerate the turn-on speed of SCR 200 when integrated circuit 100 requires electrostatic discharge.

ESD circuit 150 includes circuits to discharge static electricity. ESD circuit 150 is coupled to the node between the first P+ region of SCR 200 and internal circuits 160. ESD circuit 150 is also coupled to power rail 182.

In some embodiments, the node between the first P+ region of SCR 200 and internal circuits 160 is coupled to a radio frequency input ($RF_{in}$) 155.

Internal circuits 160 include relevant circuits of an integrated circuit chip. For example, internal circuits 160 may include circuits of a processor, memory, or an application-specific integrated circuit (ASIC). Integrated circuits 160 are coupled to power rails 181 and 182.

Power-rail ESD clamp circuit 170 includes a resistor 171, a capacitor 172, a P-type metal oxide semiconductor (PMOS) transistor 173, and two N-type metal oxide semiconductor (NMOS) transistors 174 and 175. As illustrated in FIG. 1, resistor 171 and capacitor 172 are coupled in series and between power rails 181 and 182. PMOS transistor 173 and NMOS transistor 174 are coupled in series and between power rails 181 and 182. NMOS transistor 175 is also coupled between power rails 181 and 182. A node between resistor 171 and capacitor 172 is coupled to a node on a connection between gate terminals of PMOS transistor 173 and NMOS transistor 174. A node on a connection between a drain terminal of PMOS transistor 173 and a source terminal of NMOS transistor 174 is coupled to a gate terminal of NMOS transistor 175.

In some embodiments, power-rail ESD clamp circuit 170 may be implemented by other different circuits.

Figure 2:
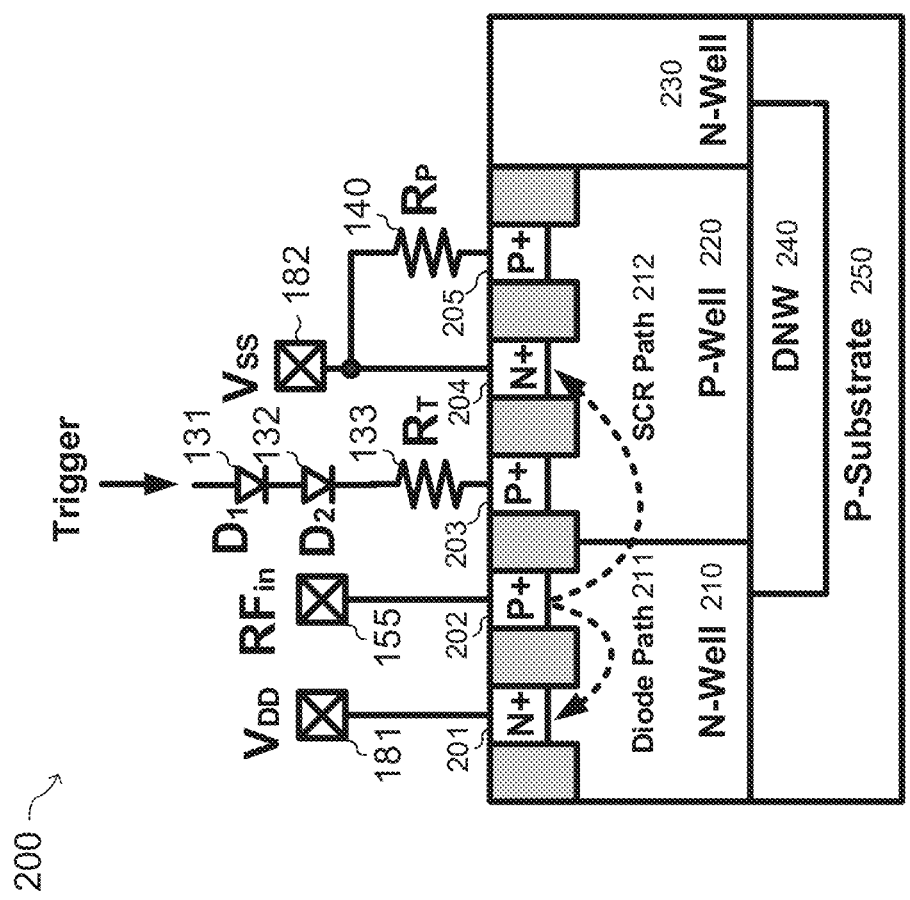
FIG. 2 illustrates an exemplary cross-sectional view of a silicon-controlled rectifier (SCR), in accordance with some embodiments.

FIG. 2 illustrates an exemplary cross-sectional view of silicon-controlled rectifier (SCR) 200, in accordance with some embodiments. SCR 200 includes a first N+ region 201, a first P+ region 202, a second P+ region 203, a second N+ region 204, a third P+ region 205, a first N-Well region 210, a P-Well region 220, a second N-Well region 230, a deep n-well region (DWN) 240, and a P-substrate region 250. N+ region 201 and P+ region 202 are in N-Well region 210. P+ region 203, N+ region 204, and P+ region 205 are in P-Well region 220.

N+ region 201 in N-Well region 210 is coupled to power rail 181. This corresponds to the N-Well region of SCR 200 being coupled to power rail 181, as shown FIG. 1.

P+ region 202 is coupled to $RF_{in}$ 155. This corresponds to the first P+ region of SCR 200 being coupled to $RF_{in}$ 155, as described above with reference to FIG. 1.

P+ region 203 is coupled to resistor $R_T$ 133, diode $D_2$ 132, and diode $D_1$ 131 for receiving a trigger signal from T-coil circuit 120. This corresponds to the second P+ region of SCR 200 being coupled to inductor $L_2$ 122 of T-coil circuit 120 via resistor $R_T$ 133, diode $D_2$ 132, and diode $D_1$ 131 of signal-loss prevention circuit 130, as described above with reference to FIG. 1.

N+ region 204 is coupled to power rail 182. This corresponds to the N+ region of SCR 200 being coupled to power rail 182, as described above with reference to FIG. 1.

P+ region 205 in P-Well region 220 is coupled to power rail 182 via resistor $R_P$ 140. This corresponds to the P-Well region of SCR 200 being coupled to power rail 182 via resistor $R_P$ 140, as shown FIG. 1.

In some embodiments, a diode path 211 is formed from P+ region 202 to N+ region 201. Diode path 211 provides a conductive path from $RF_{in}$ 155 to power rail 181, i.e., $V_{DD}$.

In some embodiments, an SCR path 212 is formed from P+ region 202 to N+ region 204. SCR path 212 provides a conductive path from $RF_{in}$ 155 to power rail 182, i.e., $V_{SS}$.

Figure 3A:
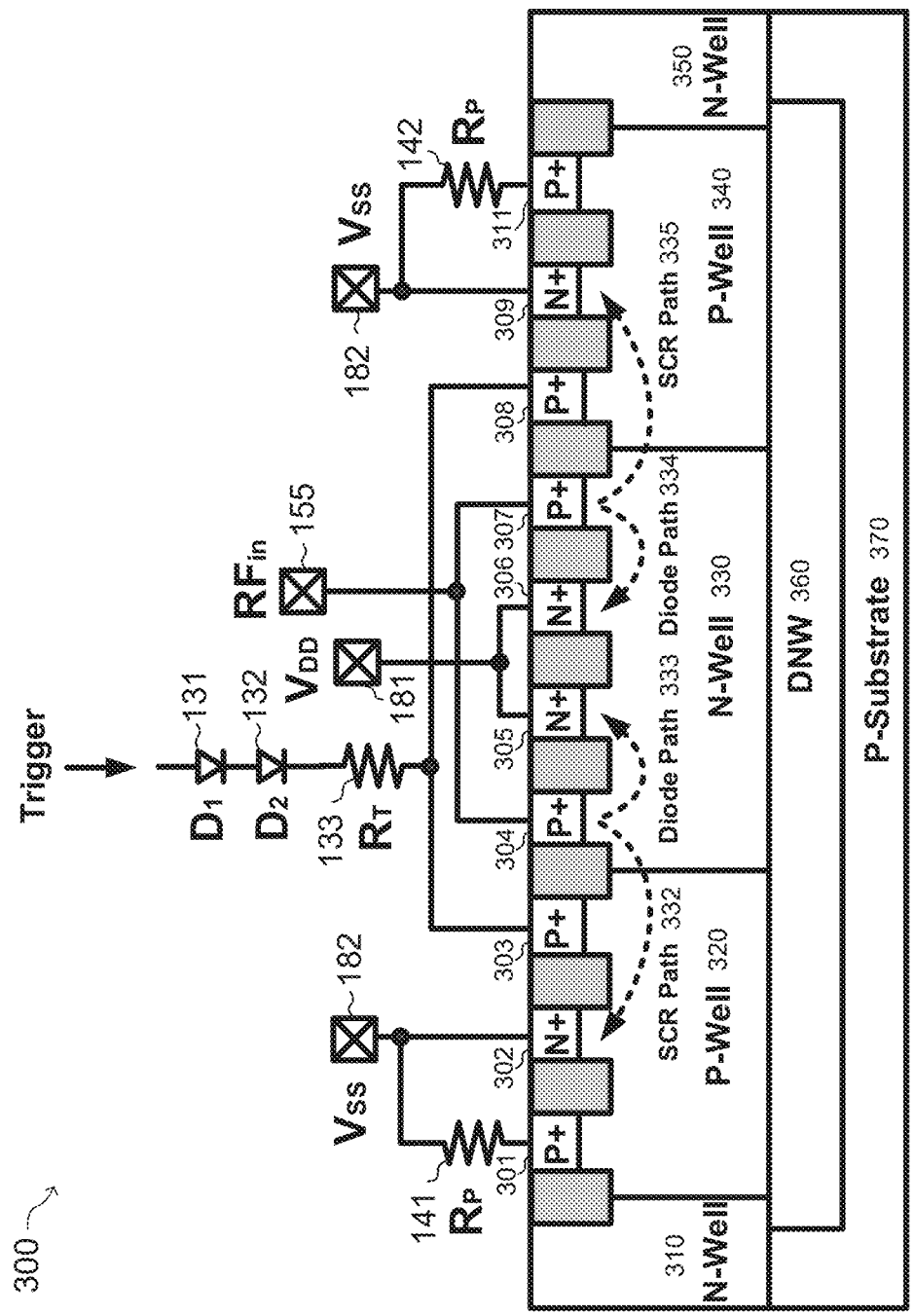
FIG. 3A illustrates an exemplary cross-sectional view of a two-finger SCR, in accordance with some embodiments.

FIG. 3A illustrates an exemplary cross-sectional view of a two-finger SCR 300, in accordance with some embodiments. Two-finger SCR 300 includes a first P+ region 301, a first N+ region 302, a second P+ region 303, a third P+ region 304, a second N+ region 305, a third N+ region 306, a fourth P+ region 307, a fifth P+ region 308, a fourth N+ region 309, a sixth P+ region 311, a first N-Well region 310, a first P-Well region 320, a second N-Well region 330, a second P-Well region 340, a third N-Well region 350, a deep n-well region (DWN) 360, and a P-substrate region 370. P+ region 301, N+ region 302, and P+ region 303 are in P-Well region 320. P+ region 304, N+ region 305, N+ region 306, and P+ region 307 are in N-Well region 330. P+ region 308, N+ region 309, and P+ region 311 are in P-Well region 340.

P+ region 301 in P-Well region 320 is coupled to a power rail 182 via resistor $R_P$ 141. This corresponds to the P-Well region of SCR 200 being coupled to power rail 182 via resistor $R_P$ 140, as shown in FIG. 1.

N+ region 302 is coupled to power rail 182. This corresponds to the N+ region of SCR 200 being coupled to power rail 182, as described above with reference to FIG. 1.

P+ region 303 is coupled to resistor $R_T$ 133, diode $D_2$ 132, and diode $D_1$ 131 for receiving a trigger signal from T-coil circuit 120. This corresponds to the second P+ region of SCR 200 being coupled to inductor $L_2$ 122 of T-coil circuit 120 via resistor $R_T$ 133, diode $D_2$ 132, and diode $D_1$ 131 of signal-loss prevention circuit 130, as described above with reference to FIG. 1.

P+ region 304 is coupled to $RF_{in}$ 155. This corresponds to the first P+ region of SCR 200 being coupled to $RF_{in}$ 155, as described above with reference to FIG. 1.

N+ region 305 in N-Well region 330 is coupled to power rail 181. This corresponds to the N-Well region of SCR 200 being coupled to power rail 181, as shown in FIG. 1.

N+ region 306 in N-Well region 330 is also coupled to power rail 181. This corresponds to the N-Well region of SCR 200 being coupled to power rail 181, as shown in FIG. 1.

P+ region 307 is coupled to $RF_{in}$ 155. This corresponds to the first P+ region of SCR 200 being coupled to $RF_{in}$ 155, as described above with reference to FIG. 1.

P+ region 308 is coupled to resistor $R_T$ 133, diode $D_2$ 132, and diode $D_1$ 131 for receiving the trigger signal from T-coil circuit 120. This corresponds to the second P+ region of SCR 200 being coupled to inductor $L_2$ 122 of T-coil circuit 120 via resistor $R_T$ 133, diode $D_2$ 132, and diode $D_1$ 131 of signal-loss prevention circuit 130, as described above with reference to FIG. 1.

N+ region 309 is coupled to power rail 182. This corresponds to the N+ region of SCR 200 being coupled to power rail 182, as described above with reference to FIG. 1.

P+ region 311 in P-Well region 340 is coupled to power rail 182 via resistor $R_P$ 142. This corresponds to the P-Well region of SCR 200 is coupled to power rail 182 via resistor $R_P$ 140, as shown in FIG. 1.

In some embodiments, a first SCR path 332 is formed from P+ region 304 to N+ region 302. SCR path 332 provides a conductive path from $RF_{in}$ 155 to power rail 182, i.e., $V_{SS}$.

In some embodiments, a first diode path 333 is formed from P+ region 304 to N+ region 305. Diode path 333 provides a conductive path from $RF_{in}$ 155 to power rail 181, i.e., $V_{DD}$.

In some embodiments, a second diode path 334 is formed from P+ region 307 to N+ region 306. Diode path 334 provides a conductive path from $RF_{in}$ 155 to power rail 181, i.e., $V_{DD}$.

In some embodiments, a second SCR path 335 is formed from P+ region 307 to N+ region 309. SCR path 335 provides a conductive path from $RF_{in}$ 155 to power rail 182, i.e., $V_{SS}$.

Figure 3B:
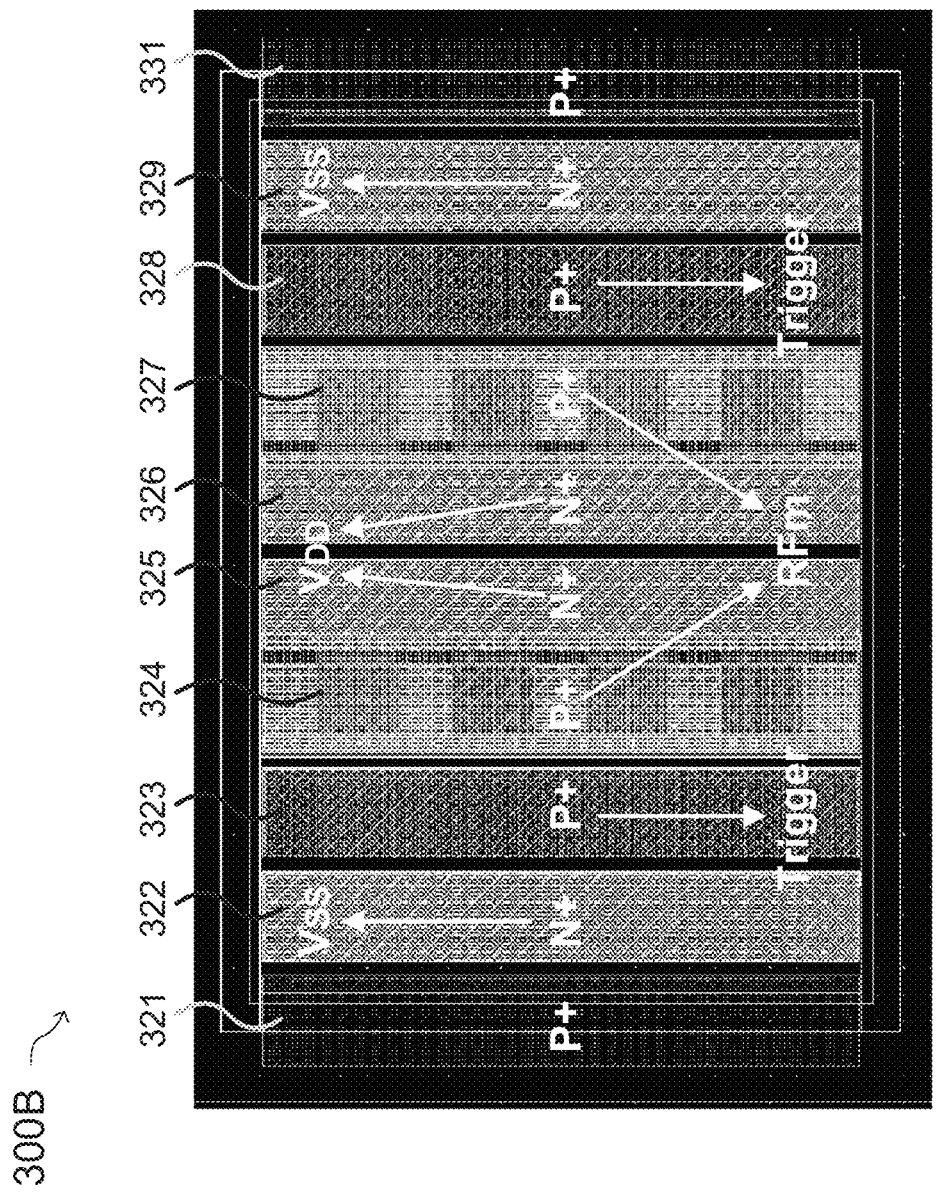
FIG. 3B illustrates a layout of an exemplary two-finger SCR, in accordance with some embodiments.

FIG. 3B illustrates a layout 300B of two-finger SCR 300, in accordance with some embodiments. Layout 300B of two-finger SCR 300 includes a first P+ region 321, a first N+ region 322, a second P+ region 323, a third P+ region 324, a second N+ region 325, a third N+ region 326, a fourth P+ region 327, a fifth P+ region 328, a fourth N+ region 329, a sixth P+ region 331. These regions correspond to P+ region 301, N+ region 302, P+ region 303, P+ region 304, N+ region 305, N+ region 306, P+ region 307, P+ region 308, N+ region 309, and P+ region 311, respectively.

For example, N+ regions 322 and 329 are coupled to $V_{SS}$. P+ regions 323 and 328 are coupled to receive the trigger signal. P+ regions 324 and 327 are coupled to $RF_{in}$ 155. N+ regions 325 and 326 are coupled to $V_{DD}$.

FIG. 4 illustrates a layout 400 of an exemplary integrated circuit, in accordance with some embodiments. Layout 400 includes a first gate terminal 410, a first source terminal 420, a second gate terminal 430, a third gate terminal 440, a second source terminal 450, and a fourth gate terminal 460, stacked diodes with embedded silicon-controlled rectifier (SDSCR) 470, an SCR 480, and a T-coil circuit 490. Gate terminals 410, 430, 440, and 460 (FIG. 4) are configured to be coupled to a power rail of a voltage $V_{SS}$, e.g., power rail 182 in FIG. 1. Source terminal 420 (FIG. 4) corresponds to I/O pad 110 in FIG. 1. Source terminal 450 (FIG. 4) corresponds to $RF_{in}$ 155 in FIG. 1. SDSCR 470 (FIG. 4) corresponds to ESD circuit 150 in FIG. 1. SCR 480 (FIG. 4) corresponds to SCR 200 in FIG. 1. T-coil circuit 490 (FIG. 4) corresponds to T-coil circuit 120 in FIG. 1.

In some embodiments, an integrated circuit for ESD protection includes a T-coil circuit coupled to an I/O pad and an internal circuit, an SCR coupled to the T-coil circuit and the internal circuit; and a signal-loss prevention circuit coupled to the T-coil circuit and the SCR. For example, as described above with reference to FIG. 1, integrated circuit 100 includes T-coil circuit 120, SCR 200, and signal-loss prevention circuit 130. T-coil circuit 120 is coupled to I/O pad 110 and internal circuits 160. SCR 200 is coupled to T-coil circuit 120 and internal circuits 160. signal-loss prevention circuit 130 is coupled to T-coil circuit 120 and SCR 200.

When static electricity is present at I/O pad 110, ESD stresses on I/O pad 110 have four pin-combination modes: a positive-to-$V_{SS}$ (PS) mode, a negative-to-$V_{SS}$ (NS) mode, a positive-to-$V_{DD}$ (PD) mode, and a negative-to-$V_{DD}$ (ND) mode. With reference to FIG. 1, an electrostatic current 101 in the PS mode is discharged from I/O pad 110, through inductor $L_{ESD}$ 121 of T-coil circuit 120 and SCR 200, to $V_{SS}$. The static electricity at I/O pad 110 is discharged to protect internal circuits 160 from damage.

When electrostatic current 101 flows through inductor $L_{ESD}$ 121 of T-coil circuit 120, a magnetic effect causes electrostatic current 102 to occur in inductor $L_2$ 122 of T-coil circuit 120. Electrostatic current 102 flows through signal-loss prevention circuit 130 to the P+ region of SCR 200. Electrostatic current 102 serves to accelerate a turn-on speed of SCR 200. When SCR 200 is turned on faster, electrostatic current 101 is configured to discharge the static electricity at I/O pad 110 faster.

In some embodiments, the signal-loss prevention circuit includes a resistor coupled to the T-coil circuit and the SCR. An electrostatic current is configured to flow through the resistor and turn on the SCR. For example, as shown in FIG. 1, signal-loss prevention circuit 130 includes resistor $R_T$. Resistor $R_T$ is coupled to T-coil circuit 120 and SCR 200. Electrostatic current 102 flows through resistor $R_T$ and turns on SCR 200. In some embodiments, resistance of resistor $R_T$ is the main resistive component of signal-loss prevention circuit 130 and is used to adjust a volume of electrostatic current 102 so that electrostatic current 102 is able to turn on SCR 200 and accelerate the turn-on speed of SCR 200 for electrostatic discharge.

In some embodiments, the signal-loss prevention circuit includes a diode circuit coupled to the T-coil circuit and the SCR. The signal-loss prevention circuit is configured to prevent signal loss. For example, as shown in FIG. 1, signal-loss prevention circuit 130 includes diode $D_1$ 131 and diode $D_2$ 132. Diode $D_1$ 131 and diode $D_2$ 132 are coupled to T-coil circuit 120 and SCR 200. In some embodiments, signal-loss prevention circuit 130 may include one, two, three, or even more diodes.

Diode $D_1$ 131 and diode $D_2$ 132 of signal-loss prevention circuit 130 are serially coupled between T-coil circuit 120 and resistor $R_T$ and serve to prevent signal loss when internal circuits 160 operate in a normal situation. When diode $D_1$ 131 and diode $D_2$ 132 are turned on, resistances of forward-biased diode $D_1$ 131 and diode $D_2$ 132 are minor.

In some embodiments, the integrated circuit for ESD protection further includes a power-rail ESD clamp circuit coupled to a first power rail and a second power rail. The internal circuit is coupled to the first and second power rails. For example, as shown in FIG. 1, integrated circuit 100 for ESD protection further includes power-rail ESD clamp circuit 170. Power-rail ESD clamp circuit 170 is coupled between power rail 181 and power rail 182, i.e., $V_{DD}$ and $V_{SS}$. Internal circuits 160 are also coupled between power rails 181 and 182.

Power-rail ESD clamp circuit 170 is configured to protect internal circuits 160 in a negative-to-$V_{DD}$ (ND) mode as described below.

In some embodiments, the integrated circuit for ESD protection further includes an ESD circuit coupled to a node between the SCR and the internal circuit. For example, as shown in FIG. 1, integrated circuit 100 includes ESD circuit 150. ESD circuit 150 is coupled to a node between SCR 200 and internal circuits 160.

Power-rail ESD clamp circuit 170 and ESD circuit 150 are configured to discharge static electricity in the ND mode. An electrostatic current 104 flows from $V_{DD}$ to $RF_{in}$ 155.

In some embodiments, the ESD circuit is configured to not turn on by a signal of a negative direct-current level. For example, as shown in FIG. 1, ESD circuit 150 is coupled to the node between SCR 200 and internal circuits 160. ESD circuit 150 is configured to protect internal circuits 160 in a negative-to-$V_{SS}$ (NS) mode. An electrostatic current 103 flows from $V_{SS}$ to $RF_{in}$ 155 in the NS mode. When internal circuits 160 operates in normal situation, internal circuits 160 may be configured to receive various signals from $RF_{in}$ 155. Some of the signals may have a negative direct-current level, which may turn on ESD circuit 150. If the signals turn on ESD circuit 150, internal circuits 160 may not work correctly. Thus, ESD circuit 150 is also configured to not turn on by a signal of a negative direct-current level at $RF_{in}$ 155.

In some embodiments, the integrated circuit for ESD protection is configured to operate in the NS mode. The ESD circuit is configured to turn on to discharge static electricity in the NS mode. For example, integrated circuit 100 is configured to operate in the NS mode. ESD circuit 150 is configured to turn on to discharge static electricity in the NS mode so that internal circuits 160 are protected from damage.

In some embodiments, the ESD circuit includes a parasitic capacitance of twenty femtofarads. For example, ESD circuit 150 includes a parasitic capacitance of twenty femtofarads. With the parasitic capacitance of twenty femtofarads, ESD circuit 150 is configured to turn on to discharge static electricity in the NS mode and configured to not turn on by a signal of a negative direct-current level at $RF_{in}$ 155.

In some embodiments, the SCR includes a P+/Nwell/Pwell/N+ structure. For example, as shown in FIG. 1, SCR 200 includes a P+/Nwell/Pwell/N+ structure. The P+/Nwell/Pwell/N+ structure includes the first P+ region, N-Well region, P-Well region, and N+ region of SCR 200. As another example, the P+/Nwell/Pwell/N+ structure may include P+ region 202, N-Well region 210, P-Well region 220, and N+ region 204 of SCR 200 in FIG. 2.

In some embodiments, the signal-loss prevention circuit includes a diode circuit coupled to the T-coil circuit and the SCR. The integrated circuit for ESD protection further includes a resistor coupled to the SCR and is coupled to a power rail. The diode circuit and the resistor are configured to prevent signal loss at a radio frequency. For example, as shown in FIG. 1, signal-loss prevention circuit 130 includes diode $D_1$ 131 and diode $D_2$ 132. Diode $D_1$ 131 and diode $D_2$ 132 are coupled to T-coil circuit 120 and SCR 200. Integrated circuit 100 further includes resistor $R_P$ 140. Resistor $R_P$ 140 is coupled from the P-Well region of SCR 200 to power rail 182, i.e., $V_{SS}$. Diode $D_1$ 131, diode $D_2$ 132 and resistor $R_P$ 140 are configured to prevent signal loss at a radio frequency. As another example, in the P+/Nwell/Pwell/N+ structure of SCR 200 shown in FIG. 2, P+ region 205 of SCR 200 is further coupled to resistor $R_P$ 140. Resistor $R_P$ 140 is configured to combine with diode $D_1$ 131 and diode $D_2$ 132 for preventing loss of high-frequency signals in normal operations.

In some embodiments, the diode circuit includes a parasitic capacitance of ten femtofarads, and the resistor, coupled to the SCR and a power rail, has a resistance of one hundred fifty ohms. For example, diode $D_1$ 131 and diode $D_2$ 132 in series have a parasitic capacitance of ten femtofarads. Resistor $R_P$ 140 has a resistance of one hundred fifty ohms. However, as explained below, these values are only exemplary and the embodiments herein are not so limited.

In some embodiments, the SCR includes a two-finger SCR structure. For example, as shown in FIG. 3A, SCR 200 includes two-finger SCR structure 300.

In some embodiments, the SCR has a length of forty micrometers and a width of sixteen micrometers. For example, SCR 200 has a length of forty micrometers and a width of sixteen micrometers. The width of sixteen micrometers includes a width of metal lines. The size of SCR 200 is used to sustain a large electrostatic current to flow through SCR 200 during electrostatic discharge. However, as explained below, these dimensions of SCR 200 are exemplary only and persons of ordinary skill will now understand that SCR 200 can be provided with different dimensions.

In some embodiments, the SCR includes a parasitic capacitance of thirty femtofarads. For example, SCR 200 includes a parasitic capacitance of thirty femtofarads.

In some embodiments, the integrated circuit for ESD protection is configured to operate in a positive-to-$V_{SS}$ (PS) mode. The SCR is configured to turn on to discharge static electricity in the PS mode. A current of the T-coil circuit is configured to accelerate a turn-on speed of the SCR via the signal-loss prevention circuit. For example, as shown in FIG. 1, integrated circuit 100 is configured to operate in a PS mode. SCR 200 is configured to turn on to discharge static electricity in the PS mode. Electrostatic current 101 of T-coil circuit 120 is configured to accelerate a turn-on speed of SCR 200 via signal-loss prevention circuit 130.

In other words, T-coil circuit 120 is configured to trigger SCR 200 to discharge static electricity. A combination of T-coil circuit 120 and SCR 200 is a T-coil-triggered SCR. The T-coil-triggered SCR is capable of operating across a wide range of frequencies. The T-coil-triggered SCR is configured to turn on SCR 200 correctly and quickly to discharge a large amount of static electricity in a short time.

In some embodiments, the signal-loss prevention circuit includes a diode circuit coupled to the T-coil circuit and the SCR. The current of the T-coil circuit is configured to turn on the diode circuit. For example, as shown in FIG. 1, signal-loss prevention circuit 130 includes diode $D_1$ 131 and diode $D_2$ 132. Diode $D_1$ 131 and diode $D_2$ 132 are coupled to T-coil circuit 120 and SCR 200. Electrostatic current 102 of T-coil circuit is configured to turn on diode $D_1$ 131 and diode $D_2$ 132, and flow through resistor $R_T$ 133 to turn on SCR 200 quickly.

In some embodiments, the integrated circuit for ESD protection is configured to operate in a positive-to-$V_{DD}$ (PD) mode. The SCR is configured to discharge static electricity via a diode path in the PD mode. For example, as shown in FIG. 1, integrated circuit 100 is configured to operate in the PD mode. SCR 200 is configured to discharge static electricity via diode path 211, shown in FIG. 2, in the PD mode. An electrostatic current 105 flows from the N-Well of SCR 200 to power rail 181, i.e., $V_{DD}$.

In some embodiments, an integrated circuit for ESD protection includes a T-coil circuit coupled to an I/O pad and an internal circuit, an SCR coupled to the T-coil circuit and the internal circuit, and a trigger circuit coupled to the T-coil circuit and the SCR. The T-coil circuit is configured to trigger, via the trigger circuit, the SCR for discharging static electricity.

For example, as illustrated in FIG. 1, integrated circuit 100 includes T-coil circuit 120. T-coil circuit 120 is coupled to I/O pad 110 and internal circuits 160. Integrated circuit 100 also includes SCR 200. SCR 200 is coupled to T-coil circuit 120 and internal circuits 160. Integrated circuit 100 also includes a trigger circuit, i.e., signal-loss prevention circuit 130. The trigger circuit is coupled to T-coil circuit 120 and SCR 200. T-coil circuit 120 is configured to trigger, via the trigger circuit, SCR 200 for discharging static electricity.

In some embodiments, the trigger circuit includes a resistor coupled to the T-coil circuit and the SCR. An electrostatic current flows through the resistor and turns on the SCR. The trigger circuit also includes a diode circuit. The diode circuit is coupled to the T-coil circuit and the SCR and is configured to prevent signal loss. For example, as illustrated in FIG. 1, the trigger circuit, i.e., signal-loss prevention circuit 130, includes resistor $R_T$ 133. Resistor $R_T$ 133 is coupled to T-coil circuit 120 and SCR 200. Electrostatic current 102 flows through resistor $R_T$ 133 and turns on SCR 200. The trigger circuit, i.e., signal-loss prevention circuit 130, also includes diode $D_1$ 131 and diode $D_2$ 132. Diode $D_1$ 131 and diode $D_2$ 132 are coupled to T-coil circuit 120 and SCR 200. Diode $D_1$ 131 and diode $D_2$ 132 are configured to prevent signal loss.

FIG. 5 is a flowchart of an exemplary method 500, in accordance with some embodiments. Method 500 may be practiced by all circuits disclosed and illustrated in the present disclosure. Method 500 includes providing a discharging current path from an input/output (I/O) pad to ground via a silicon-controlled rectifier (SCR) when an electrostatic current occurs (step 510), accelerating a turn-on speed of the SCR (step 520), providing a first current path from the SCR to a first power rail (step 530), providing a second current path from a second power rail to a radio frequency input via an ESD circuit (step 540), and providing a third current path from the first power rail to the radio frequency input via a power-rail ESD clamp circuit and the ESD circuit (step 550).

Step 510 includes providing a discharging current path from an input/output (I/O) pad to ground via an SCR when an electrostatic current occurs. For example, as shown in FIG. 1, integrated circuit 100 provides a discharging current path for electrostatic current 101 from I/O pad 110 to power rail 182 via T-coil circuit 120 and SCR 200. Power rail 182 is coupled to $V_{SS}$, i.e., a ground level voltage.

Step 520 includes accelerating a turn-on speed of the SCR. For example, as shown in FIG. 1, integrated circuit 100 provides a current path through signal-loss prevention circuit 130 from T-coil circuit 120 to SCR 200 for electrostatic current 102 to accelerate a turn-on speed of SCR 200.

Step 530 includes providing a first current path from the SCR to a first power rail. For example, as shown in FIG. 1, integrated circuit 100 provides a current path from SCR 200 to power rail 181, i.e., $V_{DD}$, for electrostatic current 105 in the PD mode.

Step 540 includes providing a second current path from a second power rail to a radio frequency input via an ESD circuit. For example, as shown in FIG. 1, integrated circuit 100 provides a current path from power rail 182, i.e., $V_{SS}$, to $RF_{in}$ 155 via ESD circuit 150 for electrostatic current 103 in the NS mode.

Step 550 includes providing a third current path from the first power rail to the radio frequency input via a power-rail ESD clamp circuit and the ESD circuit. For example, as shown in FIG. 1, integrated circuit 100 provides a current path by power-rail ESD clamp circuit 170 and ESD circuit 150 for electrostatic current 104 from power rail 181, i.e., $V_{DD}$, to $RF_{in}$ 155 in the ND mode.

This disclosure relates to a T-coil-triggered SCR for ESD protection. The T-coil-triggered SCR is capable of operating across a wide range of frequencies. The T-coil-triggered SCR is configured to turn on the SCR correctly and quickly to discharge a large amount of static electricity in a short time. The T-coil-triggered SCR does not require specific designs for different narrowband applications. There is also no need to codesign the T-coil-triggered SCR with different internal circuits. Moreover, when parasitic capacitances are the same, the T-coil-triggered SCR in this disclosure provides higher ESD protection capability than other arts.

One aspect of this disclosure relates to an integrated circuit. In some embodiments, the integrated circuit includes a T-coil circuit, an SCR, and a signal-loss prevention circuit. In some embodiments, the T-coil circuit is coupled to an I/O pad and an internal circuit. In some embodiments, the SCR is coupled to the T-coil circuit and is coupled to the internal circuit. In some embodiments, the signal-loss prevention circuit is coupled to the T-coil circuit and the SCR.

Another aspect of this disclosure relates to an integrated circuit. The integrated circuit includes a T-coil circuit, an SCR, and a trigger circuit. In some embodiments, the T-coil circuit is coupled to an I/O pad and an internal circuit. In some embodiments, the SCR is coupled to the T-coil circuit and is coupled to the internal circuit. In some embodiments, the trigger circuit is coupled to the T-coil circuit and the SCR. In some embodiments, the T-coil circuit is configured to trigger, via the trigger circuit, the SCR for discharging static electricity.

Still another aspect of this disclosure relates to a method. The method includes generating a first electrostatic current from an I/O pad to ground via an SCR and generating a second electrostatic current to accelerate a turn-on speed of the SCR.

Specific examples of resistance, capacitance, and component dimensions have been provided. However, these examples are not intended to be limiting. Persons of ordinary skill will now understand that the embodiments herein can be practiced with equal effectiveness with components having other values of resistance, capacitance, and dimensions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a T-coil circuit coupled to an input/output (I/O) pad and an internal circuit;
   a silicon-controlled rectifier (SCR) coupled to the T-coil circuit and the internal circuit; and
   a signal-loss prevention circuit coupled to the T-coil circuit and the SCR.

2. The integrated circuit of claim 1, wherein the signal-loss prevention circuit comprises:
   a resistor coupled to the T-coil circuit and the SCR,
   wherein the resistor is configured to provide a current path for an electrostatic current to flow through and turn on the SCR when the electrostatic current occurs.

3. The integrated circuit of claim 1, wherein the signal-loss prevention circuit comprises:
   a diode circuit coupled to the T-coil circuit and the SCR, and configured to prevent signal loss.

4. The integrated circuit of claim 1, further comprising:
   a power-rail electrostatic discharge (ESD) clamp circuit coupled to a first power rail and a second power rail,
   wherein the internal circuit is coupled to the first and second power rails.

5. The integrated circuit of claim 1, further comprising:
   an electrostatic discharge (ESD) circuit coupled to a node between the SCR and the internal circuit.

6. The integrated circuit of claim 5, wherein the ESD circuit is configured to not turn on by a signal of a negative direct-current level.

7. The integrated circuit of claim 5, wherein:
   the integrated circuit is configured to operate in a negative-to-$V_{SS}$ (NS) mode; and
   the ESD circuit is configured to turn on to discharge static electricity in the NS mode.

8. The integrated circuit of claim 5, wherein the ESD circuit has a parasitic capacitance of twenty femtofarads.

9. The integrated circuit of claim 1, wherein the SCR comprises:
   a P+/Nwell/Pwell/N+ structure.

10. The integrated circuit of claim 1, wherein:
    the signal-loss prevention circuit comprises a diode circuit coupled to the T-coil circuit and the SCR; and
    the integrated circuit further comprises a resistor coupled to the SCR and a power rail,
    wherein the diode circuit and the resistor are configured to prevent signal loss at a radio frequency.

11. The integrated circuit of claim 10, wherein:
    the diode circuit has a parasitic capacitance of ten femtofarads; and
    the resistor has a resistance of one hundred fifty ohms.

12. The integrated circuit of claim 1, wherein the SCR comprises:
    a two-finger SCR structure.

13. The integrated circuit of claim 1, wherein the SCR has a length of forty micrometers and a width of sixteen micrometers.

14. The integrated circuit of claim 1, wherein the SCR has a parasitic capacitance of thirty femtofarads.

15. The integrated circuit of claim 1, wherein:
    the integrated circuit is configured to operate in a positive-to-$V_{SS}$ (PS) mode;
    the SCR is configured to turn on to discharge static electricity; and
    a current of the T-coil circuit is configured to accelerate a turn-on speed of the SCR via the signal-loss prevention circuit.

16. The integrated circuit of claim 15, wherein:
    the signal-loss prevention circuit comprises a diode circuit coupled to the T-coil circuit and the SCR; and
    the current of the T-coil circuit is configured to turn on the diode circuit.

17. The integrated circuit of claim 1, wherein:
    the integrated circuit is configured to operate in a positive-to-$V_{DD}$ (PD) mode; and
    the SCR is configured to discharge static electricity via a diode path in the PD mode.

18. An integrated circuit, comprising:
    a T-coil circuit coupled to an input/output (I/O) pad and an internal circuit;
    a silicon-controlled rectifier (SCR) coupled to the T-coil circuit and the internal circuit; and
    a trigger circuit coupled to the T-coil circuit and the SCR,
    wherein the T-coil circuit is configured to trigger, via the trigger circuit, the SCR for discharging static electricity.

19. The integrated circuit of claim 18, wherein the trigger circuit comprises:
    a resistor coupled to the T-coil circuit and the SCR, wherein an electrostatic current flows through the resistor and turns on the SCR; and
    a diode circuit coupled to the T-coil circuit and the SCR, and configured to prevent signal loss.

20. An integrated circuit, comprising:
a coil circuit coupled to an input/output (I/O) pad and an internal circuit, the coil circuit including an inductor;
a silicon-controlled rectifier (SCR) coupled to the coil circuit and the internal circuit; and
a diode circuit coupled to the coil circuit and the SCR, wherein:
  the inductor and the SCR are configured to provide a first current path for discharging from the I/O pad to a ground when an electrostatic current occurs; and
  the diode circuit is configured to provide a second current path to accelerate a turn-on speed of the SCR.

* * * * *